US010243247B2

(12) United States Patent
Chieh et al.

(10) Patent No.: US 10,243,247 B2
(45) Date of Patent: Mar. 26, 2019

(54) FREQUENCY TUNABLE REFLECTIONLESS BANDSTOP FILTER USING L-RESONATORS

(71) Applicant: SPAWAR Systems Center Pacific, San Diego, CA (US)

(72) Inventors: Jia-Chi S. Chieh, San Diego, CA (US); Jason F. Rowland, San Diego, CA (US)

(73) Assignee: The United States of America as represented by Secretary of the Navy, Washington, DC (US)

( * ) Notice: Subject to any disclaimer, the term of this patent is extended or adjusted under 35 U.S.C. 154(b) by 29 days.

(21) Appl. No.: 15/621,219

(22) Filed: Jun. 13, 2017

(65) Prior Publication Data

US 2018/0062232 A1   Mar. 1, 2018

Related U.S. Application Data

(60) Provisional application No. 62/381,680, filed on Aug. 31, 2016.

(51) Int. Cl.
| | |
|---|---|
| *H01P 1/203* | (2006.01) |
| *H03H 7/06* | (2006.01) |
| *H03H 7/01* | (2006.01) |
| *H03H 7/18* | (2006.01) |
| *H03H 9/54* | (2006.01) |

(52) U.S. Cl.
CPC ............ *H01P 1/203* (2013.01); *H01P 1/2039* (2013.01); *H01P 1/20327* (2013.01); *H03H 7/0123* (2013.01); *H03H 7/0153* (2013.01); *H03H 7/06* (2013.01); *H03H 7/18* (2013.01); *H03H 9/542* (2013.01)

(58) Field of Classification Search
CPC .... H01P 1/203; H01P 1/2037; H01P 1/20327; H03H 7/06
USPC .................................................. 333/172, 176
See application file for complete search history.

(56) References Cited

U.S. PATENT DOCUMENTS 5,357,211 A * 10/1994 Bryson ............ G01R 31/31924
327/108
7,839,350 B2    11/2010 Nagai
(Continued)

OTHER PUBLICATIONS

J.Y. Shao, Y.-S. Lin, "Millimeter-wave bandstop filter with absorptive stopband ," 2014 IEEE MTT-S Int. Microwave Symp. Dig., pp. 1-4.

(Continued)

*Primary Examiner* — Rakesh B Patel
(74) *Attorney, Agent, or Firm* — SPAWAR Systems Center Pacific; Kyle Eppele; Susanna J. Torke

(57) ABSTRACT

A bandstop filter includes a coupled line bandstop filter, a capacitor and a resistor. The coupled line bandstop filter includes a transmission line element and a shaped transmission line element. The shaped transmission line element includes a coupled line element disposed so as to electromagnetically couple with the transmission line element, and a second line element disposed so as not to be parallel with the transmission line element. The capacitor is electrically connected to the coupled line element. A portion of the received oscillating signal includes a bandstop frequency. Physical attributes of the coupled line bandstop filter, the capacitor and the resistor are such that the portion of the received oscillating signal including the bandstop frequency is attenuated.

15 Claims, 8 Drawing Sheets

(56) References Cited

U.S. PATENT DOCUMENTS 8,981,873 B2  3/2015  Zhang et al.
9,099,985 B2  8/2015  Huang et al.

OTHER PUBLICATIONS

Jhih-Ying Shao; Yo-Shen Lin, "Narrowband Coupled-Line Bandstop Filter With Absorptive Stopband," in Microwave Theory and Techniques, IEEE Transactions, vol. 63, No. 10, pp. 3469-3478, Oct. 2015.

* cited by examiner

FREQUENCY TUNABLE REFLECTIONLESS BANDSTOP FILTER USING L-RESONATORS

The present application claims priority from U.S. Provisional Application No. 62/381,680 filed Aug. 31, 2016, the entire disclosure of which is incorporated herein by reference.

FEDERALLY-SPONSORED RESEARCH AND DEVELOPMENT

Frequency Tunable Reflectionless Bandstop Filter Using L-Resonators is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_T2@navy.mil. Reference Navy Case Number 103,802.

BACKGROUND OF THE INVENTION

Frequency tunable band-stop filters are widely used to remove undesirable signals. Most band-stop filters are reflection type filters, meaning that at the frequency where the filter rejects a signal, that rejected signal is reflected back to the input. This is undesirable for many reasons. For example, consider a microwave or radio frequency receiver that receives a signal through a RF port.

If the receiver utilizes a frequency mixer, it most likely uses a band-stop filter to rejected unwanted signals. When the rejected signal is reflected by the band-stop filter, it may leak into the RF port. Once the rejected signal leaks back to the RF port, it may be remixed into the input signal, which is known as self-mixing and is very undesirable across most applications.

Recently, reflectionless or absorptive band-stop filters have been proposed which overcome the basic limitation of reflection type filters. Through the design of lossy resonators, reflectionless type band-stop filters can achieve a theoretically infinite amount of attenuation. The current, state-of-the-art reflectionless filters are acceptable for low frequency applications. However, for high frequency applications, realization is difficult due to the parasitic and self-resonance effects from the large number of hardware elements required.

Band-stop filters have been implemented for use at high frequencies using L-resonators and they have become fairly common due to their ease of design and implementation; however, they are reflective in nature. Accordingly, for at least the foregoing reasons, there exists a need for a reflectionless band-stop filter that is easy to design and implement.

SUMMARY OF THE INVENTION

An aspect of the present invention is drawn to a band-stop filter that includes a coupled line band-stop filter, a capacitor and a resistor. The coupled line band-stop filter includes a transmission line element and a shaped transmission line element. The shaped transmission line element includes a coupled line element disposed so as to electromagnetically couple with the transmission line element, and a second line element disposed so as not to be parallel with the transmission line element. The capacitor is electrically connected to the coupled line element. A portion of the received oscillating signal includes a band-stop frequency. Physical attributes of the coupled line band-stop filter, the capacitor and the resistor are such that the portion of the received oscillating signal including the band-stop frequency is attenuated.

BRIEF DESCRIPTION OF THE DRAWINGS

The accompanying drawings, which are incorporated in and form a part of the specification, illustrate example embodiments and, together with the description, serve to explain the principles of the invention. In the drawings.

DETAILED DESCRIPTION OF THE EMBODIMENTS

Aspects of the present invention are drawn to a system and method for using a tunable quarter wave resonator with a resistor and capacitor to create a reflectionless band-stop filter.

In accordance with a first aspect of the present invention, an input signal is provided through an input port to a tunable quarter wave resonator to be filtered at a given frequency. The quarter wave resonator is tuned to the frequency that the signal should be filtered at using a varactor diode and voltage supply.

Once tuned, the quarter wave resonator is able to reflect the portion of the input signal that is to be filtered, leading to an attenuation of the input signal at the tuned resonant frequency. The capacitor and resistor that is connected to the quarter wave resonator is able to absorb and dissipate the reflected portion of the input signal, preventing it from remixing at the input port.

Multiple quarter wave resonators may be used in series for multiple filtering passes in order to reach the desired amount of attenuation. Each additional quarter wave resonator is connected to a varactor and voltage supply to tune their resonant frequency.

Each quarter wave resonator then further attenuates the input signal by reflecting a filtered portion of the signal back towards the input port. The reflected portion of the input signal is absorbed and dissipated by the capacitor and resistor on the first resonator before reaching the input port, preventing self-mixing.

A conventional band-stop filter will now be described with reference to FIG. 1.

Figure 1:
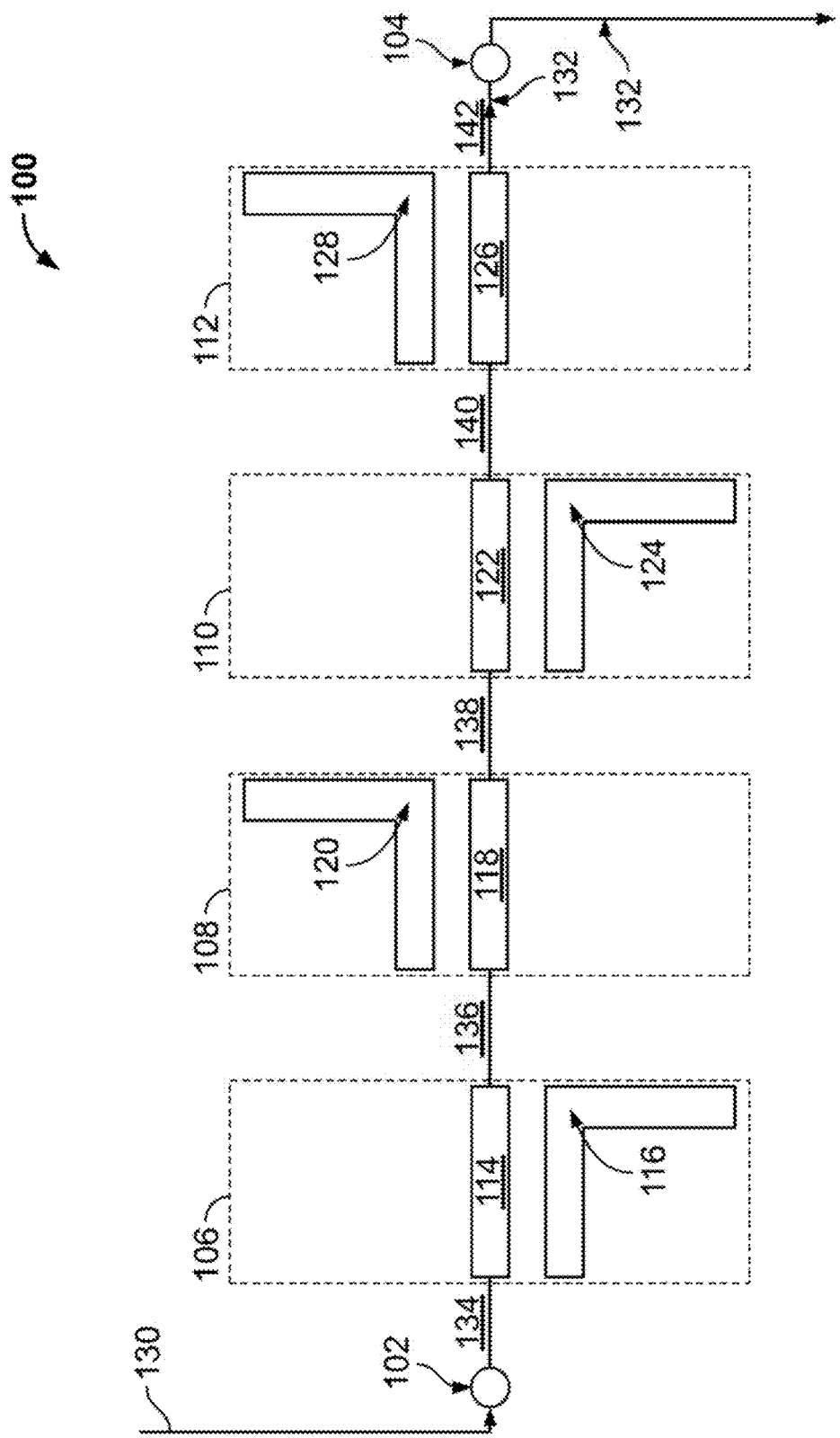
FIG. 1 illustrates a block diagram of a conventional band-stop filter.

FIG. 1 illustrates a block diagram of a conventional band-stop filter 100.

As illustrated in the figure, band-stop filter 100 includes an input port 102, an output port 104, a quarter wave resonator 106, a quarter wave resonator 108, a quarter wave resonator 110, and a quarter wave resonator 112. Quarter wave resonator 106 further includes a transmission line element 114 and a transmission line element 116. Quarter wave resonator 108 further includes a transmission line element 118 and a transmission line element 120. Quarter wave resonator 110 further includes a transmission line element 122 and a transmission line element 124. Quarter wave resonator 112 further includes a transmission line element 126 and a transmission line element 128.

Input port 102 receives input signal 130 from an external source (not shown) and provide it to transmission line element 114 via line 134.

Output port 104 receives filtered signal 132 from transmission line element 126, via line 142. Output port 104 additionally transmits filtered signal 132 to an external source (not shown).

Transmission line element 114 receives input signal 130 provided by input port 102 and provides it to transmission line element 118, via line 136. Transmission line element 118 receives input signal 130 provided by transmission line element 114 and provides it to transmission line element 122, via line 138. Transmission line element 122 receives input signal 130 provided by transmission line element 118 and provides it to transmission line element 126, via line 140. Transmission line element 126 receives input signal 130 provided by transmission line element 122 and provides it to output port 104 as filtered signal 132, via line 142.

Transmission line element 116 filters input signal 130 as it passes through transmission line element 114. Transmission line element 120 filters input signal 130 as it passes through transmission line element 118. Transmission line element 124 filters input signal 130 as it passes through transmission line element 122. Transmission line element 128 filters input signal 130 as it passes through transmission line element 126.

Each of quarter wave resonator 106, quarter wave resonator 108, quarter wave resonator 110, and quarter wave resonator 112 are L-resonators or resonant stubs. Generally, resonant stubs are realized by placing an L shaped transmission line stub with a length of $\lambda/4$ parallel to another transmission line element, where $\lambda$ is the wavelength of the signal frequency that is to be attenuated.

When a stub with a length of $\lambda/4$ is placed near a transmission line element, the stub and the transmission line become coupled. Due to this coupling, at frequencies with a wavelength of $\lambda$, the signal being transmitted along the transmission line element "sees" an open circuit, leading to the signal being reflected back towards its transmission source. At all other frequencies, the signal "sees" a closed circuit and is able to be transmitted unabated.

The use of stubs to design filters in microwave and high frequency circuits has been studied exhaustively and is well known in the state of the art.

In operation, suppose that band-stop filter 100 receives input signal 130 from an external source (not shown), that is to be attenuated to −50 decibels (dB) at frequency f with a wavelength of $\lambda$. Input port 102 receives input signal 130, which it then provides to transmission line element 114, via line 134.

Transmission line element 114 and transmission line element 116 are arranged such that they are coupled and resonate at frequency f Due to this coupling and resonance, when input signal 130 traverses transmission line element 114, the portion of input signal 130 that is near frequency f is reflected back towards input port 102.

The quality factor (Q-factor) of quarter wave resonator 106 created by the coupling of transmission line element 114 and transmission line element 116 is limited by design constraints and implementation, and therefore a portion of input signal 130 at frequency f cannot be completely reflected. Suppose that in this example embodiment, the reflection results in an attenuation of −30 dB in input signal 130 near frequency f.

The portion of input signal 130 that is not at frequency f is able to traverse transmission line element 114 without modification. At this time, transmission line element 114 provides input signal 130 to transmission line element 118, via line 136.

Similar to transmission line element 114 and transmission line element 116, transmission line element 118 and transmission line element 120 are arranged such that they are coupled and resonate at frequency f. As input signal 130 traverses transmission line element 118, another portion of input signal 130 near frequency f is reflected back towards input port 102. Suppose that in this example embodiment, input signal 130 is attenuated another −10 dB near frequency f. At this time, transmission line element 118 provides input signal 130 to transmission line element 122, via line 138.

Again, input signal 130 is further attenuated near frequency f by transmission line element 122 and transmission line element 124. Suppose that in this example embodiment, input signal 130 is attenuated an additional −5 dB near frequency f once attenuated, input signal 130 is provided to transmission line element 126, via line 140.

Transmission line element 126 and transmission line element 128 further attenuate input signal 130. Suppose that in this example embodiment, input signal 130 is further attenuated by −5 dB near frequency f. At this point, input signal 130 has been attenuated by a total of −50 dB at frequency f. Transmission line element 126 then provides input signal 130 as filtered signal 132 to output port 104, via line 142. At this time, output port 104 may transmit filtered signal 132 to an external source (not shown).

A problem with band-stop filter 100 is that attenuation is achieved by reflecting the portion of the signal near frequency f back towards input port 102. Reflecting a portion of input signal 130 towards input port 102 is undesirable across almost all applications since the reflected portion of the signal can be reabsorbed and transmitted by input port 102 which is referred to as self-mixing.

Another problem with band-stop filter 100 is that the resonant frequency of quarter wave resonator 106, quarter wave resonator 108, quarter wave resonator 110, and quarter wave resonator 112 are not variable. Since the amount of attenuation achieved by each quarter wave resonator is dependent on the resonance and coupling of the transmission line elements, the transmission line elements need to be fabricated for a predetermined wavelength λ given a frequency f. If a different frequency is to be attenuated, a different band-stop filter should be used, which is not a viable solution in practice due to complexity and size restraints.

Example systems in accordance with aspects of the present invention will now be described with reference to FIGS. 2-9.

Figure 2:
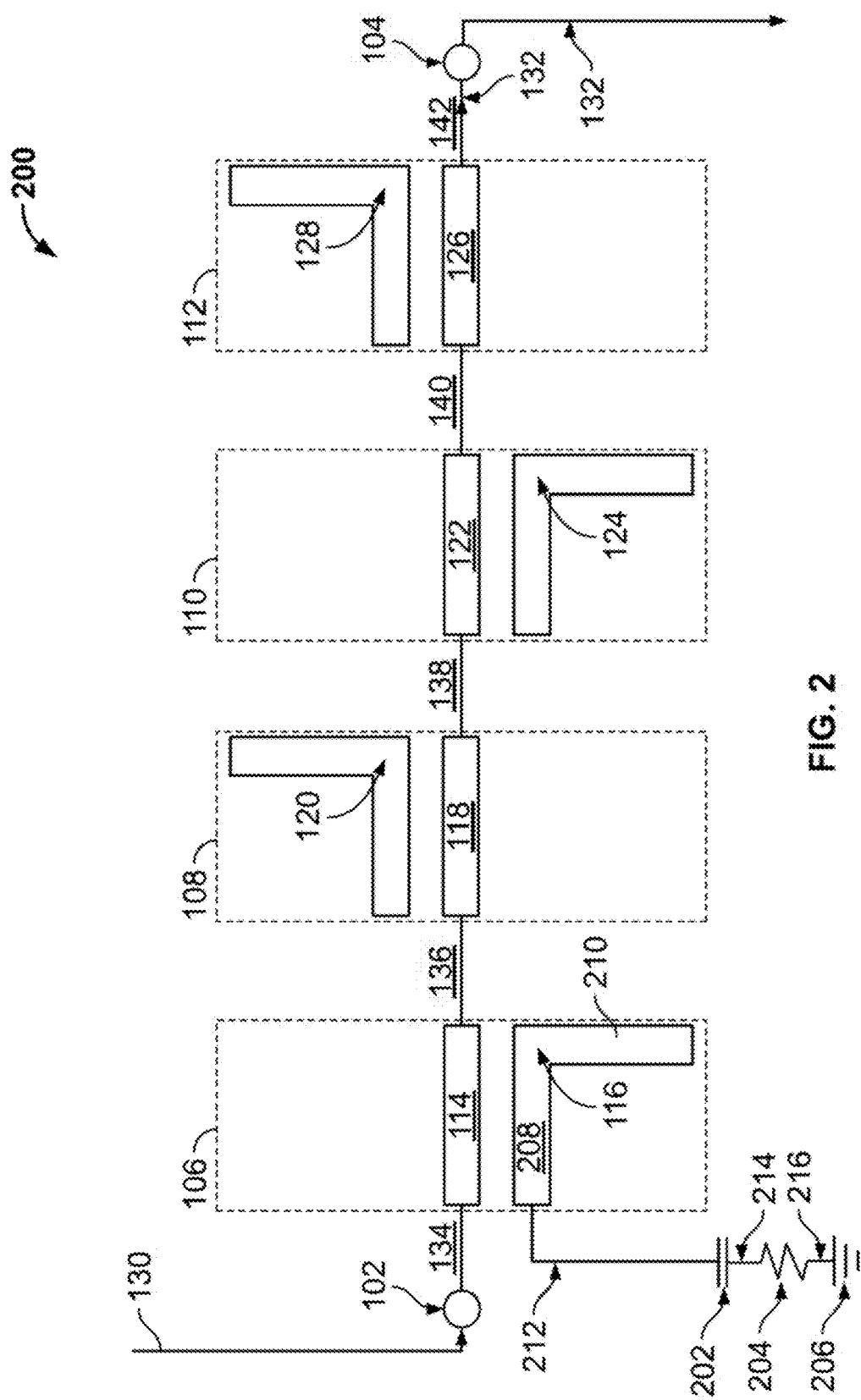
FIG. 2 illustrates a block diagram of a band-stop filter using a capacitor and resistor in accordance with aspects of the present invention.

FIG. 2 illustrates a block diagram of a band-stop filter 200 in accordance with aspects of the present invention.

As illustrated in the figure, band-stop filter 200 includes band-stop filter 100 as modified to include a quarter wave resonator 112, a capacitor 202, a resistor 204, and a ground 206. Transmission line element 116 further includes a transmission line portion 208 and a transmission line portion 210.

Transmission line element 114 additionally receives the reflected portion of input signal 130 from transmission line element 118, transmission line element 122, and transmission line element 126.

Transmission line element 114 further resonates in a first mode and a second mode where its input impedance is $Z_{Odd}$, when resonating in the first mode and its input impedance is $Z_{Even}$, when resonating in the second mode.

Transmission line element 116 receives input signal 130 due to its coupling and resonance with transmission line element 114. Transmission line element 116 additionally dissipates energy to capacitor 202, via line 212. Transmission line portion 208 of transmission line element 116 is arranged to be parallel to transmission line element 114 and transmission line portion 210 of transmission line element 116 is arranged to be perpendicular to transmission line portion 208.

Each of transmission line portion 208 and transmission line portion 210 are of a length λ/4, where λ is the wavelength at the frequency f to be attenuated by band-stop filter 200. Transmission line portion 208 and transmission line portion 210 are designed with a length of λ/4 in order to perform impedance matching through coupling between transmission line element 114 and transmission line element 116.

The impedance matching between transmission line element 114 and transmission line element 116 is important in radio frequency and microwave circuit design. Impedance matching allows control of a circuit's input impedance or output impedance in order to maximize power transfer or minimize signal reflection from the load.

For a single frequency, impedance matching is relatively simple, but becomes more difficult for multiple frequencies over a wide frequency band. For this reason, power transfer and signal reflection in a circuit can only be optimized to a certain degree, which in practice, is generally below the accepted threshold for signal return loss and insertion loss.

Transmission line portion 208 and transmission line portion 210 are drawn to illustrate the non-arbitrary design and length of each transmission line element in band-stop filter in accordance with aspects of the present invention.

Even and odd modes are the two main modes of propagation of a signal through coupled transmission lines. Odd mode impedance is defined as impedance of a single transmission line when the two lines in a pair are driven differentially, meaning the signals on each line have the same amplitude, but opposite polarity. Even mode impedance is defined as impedance of a single transmission line when the two lines in a pair are driven with a common mode signal, meaning the signals on each line have the same amplitude and polarity.

Generally, the odd mode impedance is less than the impedance of one of the single transmission lines alone, making it appear to the signal as if a ground line has been placed between the two transmission lines, which is referred to as a virtual ground. In this manner, signals in the even mode are able to pass through the transmission lines unimpeded, and the odd mode signals travel through the virtual ground.

In this example embodiment, suppose that transmission line element 114 and transmission line element 116 are resonating at a frequency f with a wavelength 2. Due to the resonance and coupling, the portion of input signal 130 that is not near frequency f is able to pass through transmission line element 114 as it is in an even mode and the portion of input signal 130 that is near frequency f would normally be reflected back towards input port 102 in an odd mode.

Since the reflected portion of input signal 130 is in an odd mode, instead of being reflected back towards input port 102 as described in the conventional band-pass filter 100 of FIG. 1, it is instead transmitted to capacitor 202 and resistor 204, via line 212. In this manner, resonator 106 is able to operate as a reflectionless type of filter.

The impedance of the even and odd modes of transmission line element 114 and dependent impedances will be discussed in detail in FIGS. 3A-B.

Transmission line element 118 receives input signal 130 from transmission line element 114, via line 136. Transmission line element 118 additionally transmits input signal 130 to transmission line element 122, via line 138.

Transmission line element 120 resonates with transmission line element 118 at a frequency f.

Transmission line element 122 receives input signal 130 from transmission line element 118, via line 138. Transmission line element 122 additionally transmits input signal 130 to transmission line element 126, via line 140.

Transmission line element 124 resonates with transmission line element 122 at a frequency f.

Transmission line element 126 receives input signal 130 from transmission line element 122, via line 140. Transmission line element 126 additionally transmits input signal 130 to output port 104 as filtered signal 132, via line 142.

Transmission line element 128 resonates with transmission line element 126 at a frequency f.

Capacitor 202 receives the reflected portion of input signal 130 from transmission line element 116, via line 212. Capacitor 202 additionally discharges to resistor 204, via line 214.

Resistor 204 receives energy discharged from capacitor 202, via line 214. Resistor 204 additionally provides energy discharged from capacitor 202 to ground 206, via line 216.

Ground 206 is ground for energy provided by resistor 204, via line 216.

For purposes of discussion, presume that band-stop filter 200 attenuates input signal 130 at a frequency f and with a wavelength λ and that input signal 130 is an oscillating signal that is received in an even mode. Band-pass filter 200 is identical to band-pass filter 100 of FIG. 1 with the addition of capacitor 202, resistor 204, and ground 206. In practice, in order to achieve a reflectionless filter, the resistance value of resistor 204 cannot be chosen arbitrarily and instead needs to be calculated through numerical simulation based on various impedances of band-pass filter 200.

Due to the coupling and resonance of transmission line element 114 and transmission line element 116, the image impedances of quarter wave resonator 106 are defined as:

$$Z_{L1} = \sqrt{Z_{Odd}Z_{Even}} \left(\frac{Z_{Even} - Z_{Odd}}{Z_{Even} + Z_{Odd}}\right) \quad (1)$$

$$Z_{L2} = \frac{Z_{Even}Z_{Odd}}{Z_{L1}} \quad (2)$$

When input port 102 is terminated by the characteristic impedance, $Z_0$, which in this example embodiment is 50Ω, the resistance value of resistor 204 such that it absorbs all of the power it receives can be determined by:

$$R = Z_0 \left(\frac{Z_{Even} + Z_{Odd}}{Z_{Even} - Z_{Odd}}\right)^2 \quad (3)$$

One additional constraint placed on the determination of the resistance value of resistor 204 is the insertion loss and the return loss of filtered signal 132. In order to determine the resistance value of resistor 204, a simulation of band-stop filter 200 is created. Once created, the simulation is run for varying values of frequency and resistance to generate results in the context of insertion loss and return loss.

Figure 3A:
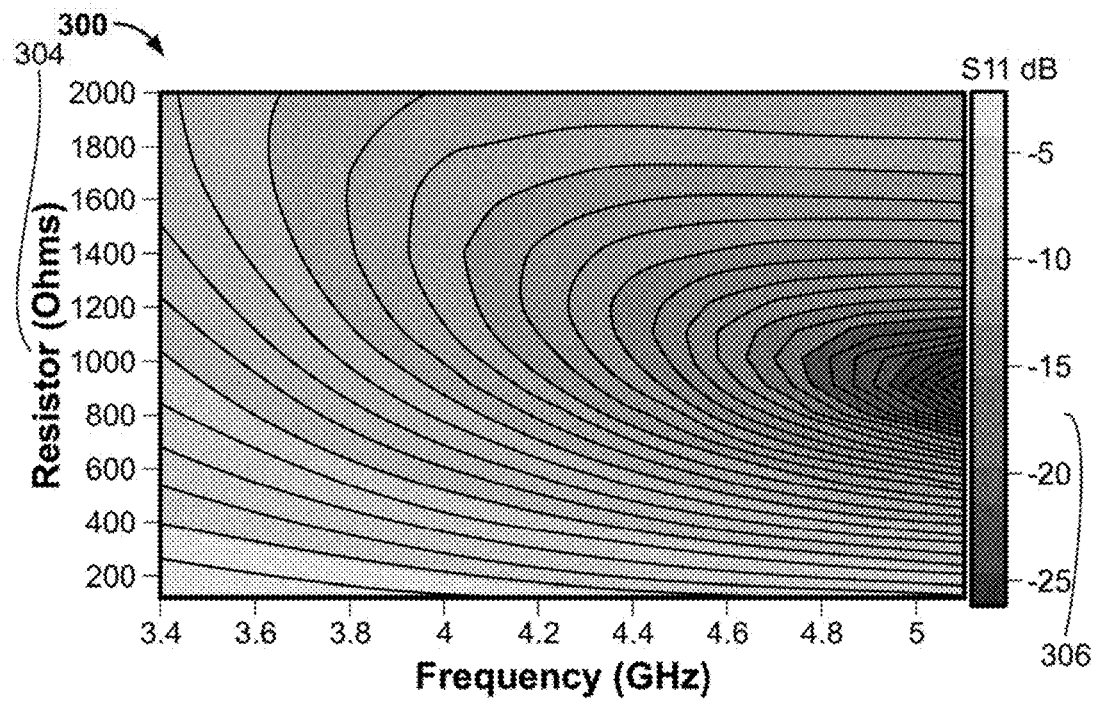
FIG. 3A illustrates a graph of the results of a parametric simulation of a band-stop filter in accordance with aspects of the present invention.

Determining the resistance value of resistor 204 through numerical simulation will now be further described with additional reference to FIGS. 3A-4.

FIG. 3A illustrates a graph 300 of the results of a numerical simulation of band-stop filter 200 in regards to return loss in accordance with aspects of the present invention.

As illustrated in the figure, graph 300 includes an X-Axis 302, a Y-Axis 304, and an intensity legend 306.

X-Axis 302 represents the frequency of input signal 130 of FIG. 2 in Hertz. Y-Axis 304 represents the resistance of resistor 204 of FIG. 2 in ohms. Intensity legend 306 represents the transmission return loss in decibels, for the corresponding resistance values of resistor 204 and frequency f, where the lower the amount of return loss is better.

In operation, a numerical simulation of band-stop filter 200 is run for varying resistance values of resistor 204. During the simulation, the resistance of resistor 204 is between 0Ω and 2000Ω and the frequency of input signal 130 is between 3.4 GHz and 5.2 GHZ.

As seen in graph 300, when the frequency is low, a higher resistance value is better in terms of return loss. When the frequency is high, a resistance of approximately 900Ω results in the lowest amount of return loss. Suppose for purposes of discussion, that the frequency at which input signal 130 should be attenuated is 4.9 GHz. In this case, the optimal resistance value for resistor 204 is 900Ω.

FIG. 3A illustrates a graph 308 of the results of a numerical simulation of band-stop filter 200 in regards to insertion loss.

As illustrated in the figure, graph 308 includes an X-Axis 310, a Y-Axis 312, and an intensity legend 314.

X-Axis 310 represents the frequency of input signal 130 of FIG. 2 in Hertz. Y-Axis 312 represents the resistance of resistor 204 of FIG. 2 in ohms. Intensity legend 314 represents the transmission insertion loss in decibels, for the corresponding resistance values of resistor 204 and frequency f, where the lower the amount of return loss is better.

In operation, a numerical simulation of band-stop filter 200 is run for varying resistance values of resistor 204. During the simulation, the resistance of resistor 204 is between 0Ω and 2000Ω and the frequency of input signal 130 is between 3.4 GHz and 5.2 GHZ.

As seen in graph 308, when the frequency is low, a higher resistance value is better in terms of return loss. When the frequency is high, a lower resistance value results in the least amount of insertion loss. Suppose for purposes of discussion, that the frequency at which input signal 130 should be attenuated is 4.9 GHz. In this case, the optimal resistance value for resistor 204 is 2000Ω.

As described above in FIGS. 3A-B, the best resistance value for resistor 204 is different depending on whether optimal insertion loss or return loss is desired. Since generally both minimum insertion loss and minimum return loss are desired, the best resistance value can be determined by choosing a value that minimizes both.

Figure 3B:
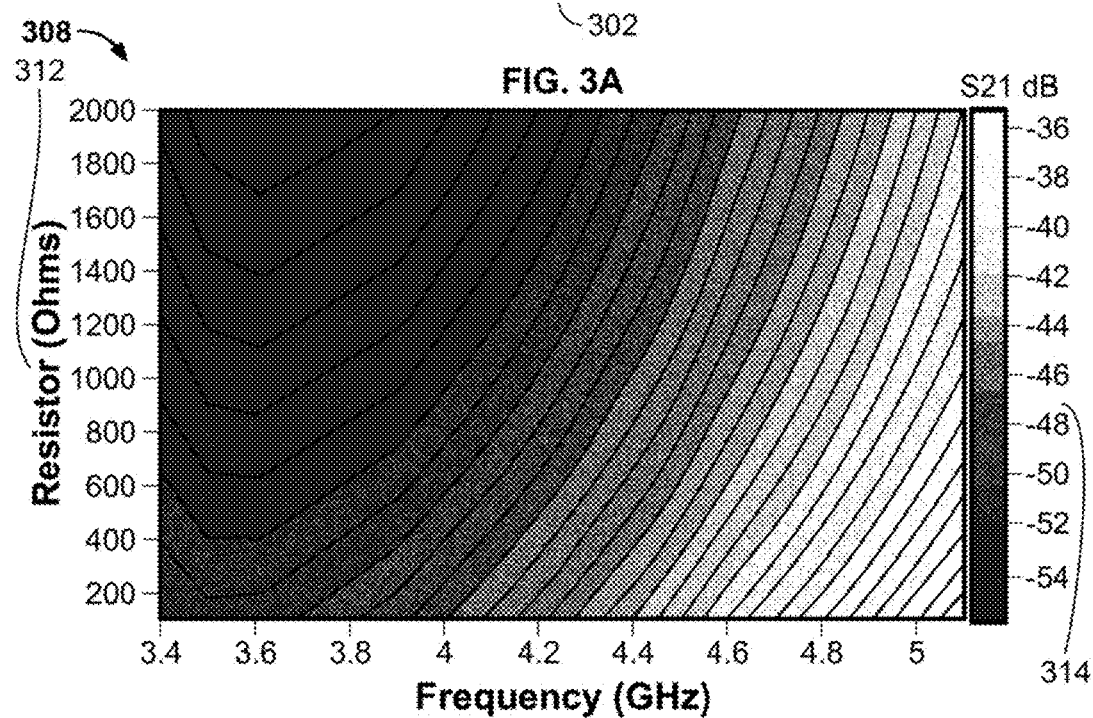
FIG. 3B illustrates a graph of the results of a parametric simulation of a band-stop filter in accordance with aspects of the present invention.

In this example embodiment, suppose since the attenuation frequency of input signal 130 is 5.1 GHz, the optimal resistance value is 900Ω based on FIG. 3A-B. However in comparison, if the attenuation frequency was 3.5 GHz, the best value would be approximately 2000Ω. In this manner, a high amount of dissipation can be achieved while minimizing signal reflection and maintaining signal integrity.

Referring back to FIG. 2, in operation, suppose that band-stop filter 200 is to attenuate input signal 130 at 4.9 GHz by −50 dB and that input signal 130 is an oscillating signal that has a frequency range of 3 GHz to 6 GHz and is in an even mode. Additionally, suppose that the components of each of quarter wave resonator 106, quarter wave resonator 108, quarter wave resonator 110, and quarter wave resonator 112 have been fabricated and arranged such that they are coupled and oscillate at 4.9 GHz. Further, each of quarter wave resonator 106, quarter wave resonator 108, quarter wave resonator 110, and quarter wave resonator 112 have been designed such that $Z_{Odd}$=46.4Ω and $Z_{Even}$=75.75Ω.

Input signal 130 is provided from an external source (not shown) to input port 102 in order to be attenuated at 4.9 GHz. Once input signal 130 is received, it is provided to transmission line element 114, via line 134.

Since quarter wave resonator 106 is resonating at 4.9 GHz, as input signal 130 traverses transmission line element 114, the portion of input signal 130 near 4.9 GHz is reflected back towards input port 102 in an odd mode. The portion of input signal 130 that is not near 4.9 GHz passes through transmission line element 114 and is then provided to transmission line element 118, via line 136.

When the portion of input signal 130 near 4.9 GHz is reflected, it is reflected in an odd mode. This means that it appears to the reflected portion that the impedance of quarter wave resonator 106 is 46.4Ω, which acts as an effective ground between transmission line element 114 and transmission line element 116. Due to the coupling of the transmission line element 114 and transmission line element 116, they behave like an impedance transformer and instead of being reflected, the unwanted portion of the signal is transferred to transmission line element 116. At this point, the filtered portion of input signal 130 is provided to capacitor 202, via line 212.

Capacitor 202 discharges the filtered portion of input signal 130 to resistor 204, via line 214. Since the resistance of resistor 204 was numerically determined beforehand, it is able to absorb all of the energy provided by capacitor 202, which it then provides to ground 206, via line 216. Due to the Q-factor of quarter wave resonator 106, input signal 130 was only attenuated by −30 dB at a frequency of 4.9 GHz.

At this point, input signal 130 is received by transmission line element 118 of quarter wave resonator 108. As described above, quarter wave resonator 108 attenuates the portion of input signal 130 near 4.9 GHz by −10 dB by reflecting it back towards input port 102 in an odd mode. Simultaneously, the portion of input signal 130 not near 4.9 GHz is provided to transmission line element 122, via line 138.

The portion of input signal 130 that is reflected by quarter wave resonator 108 is dissipated by capacitor 202, resistor 204, and ground 206 in the exact same manner as the portion reflected by quarter wave resonator 106.

Next, input signal 130 is received by transmission line element 122 of quarter wave resonator 110. The operation of quarter wave resonator 110 is identical to that of quarter wave resonator 108. It attenuates input signal 130 by −5 dB by reflecting the unwanted portion of the signal towards input port 102 to be dissipated and provides input signal 130 to transmission line element 126, via line 140.

Once input signal 130 is received by transmission line element 126 of quarter wave resonator 112, it is attenuated another −5 dB near 4.9 GHz, which results in a total attenuation of −50 dB. At this time, input signal 130 is provided to output port 104 as filtered signal 132, via line 142.

Simulated and measured results of band-stop filter 200 will now be discussed with additional reference to FIGS. 4A-B.

Figure 4A:
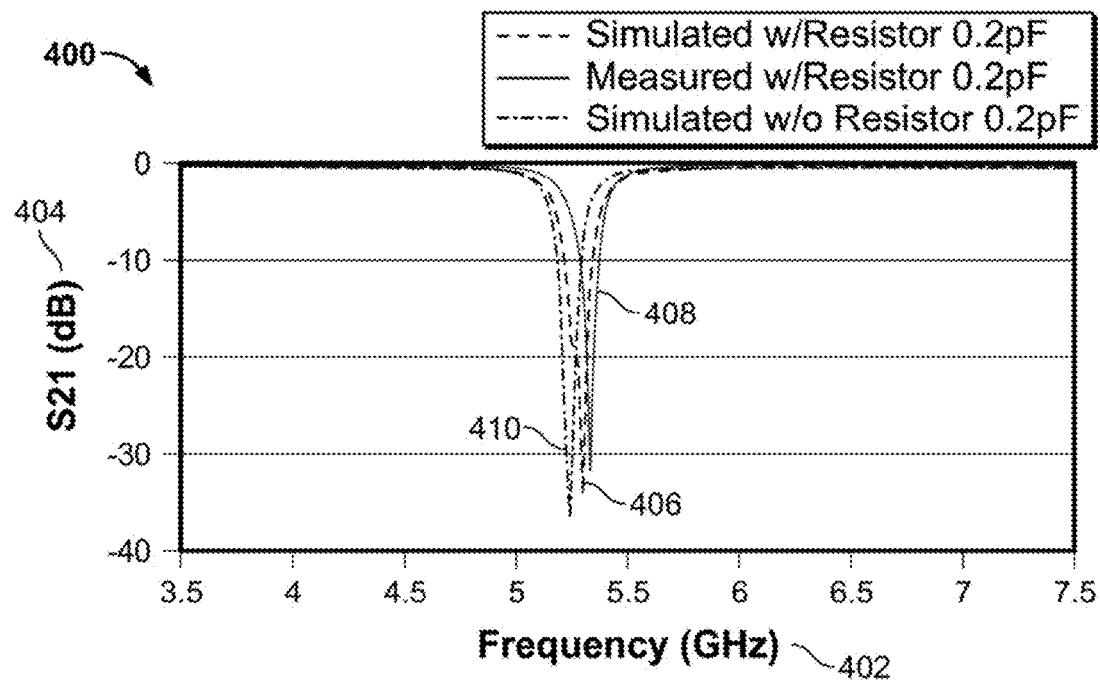
FIG. 4A illustrates a graph of simulated and measured signal insertion loss of a band-stop filter in accordance with aspects of the present invention.

FIG. 4A illustrates graph 400 comparing the measured and simulated insertion loss results of band-stop filter 200 in accordance with aspects of the present invention.

s shown in the figure, graph 400 includes an X-Axis 402, a Y-Axis 404, a line 406, a line 408, and a line 410.

X-Axis 402 represents frequency in GHz. Y-Axis 404 represents the insertion loss of band-stop filter 200 in decibels. Line 406 represents the simulated insertion loss of band-stop filter 200. Line 408 represents the measured insertion loss of band-stop filter 200. Line 410 illustrates the simulated insertion loss of a reflective band-stop filter.

In operation, when comparing line 406 and line 408, it can be seen that there is a high correlation between the measured and simulated insertion loss of an input signal by band-stop filter 200; the measured attenuation is approximately −30 decibels as predicted via simulation. The correlation between the measured and simulated results of band-stop filter 200 serves to illustrate real-world functionality. Additionally, when comparing line 406 and line 408 to line 410, it can be seen that the amount of insertion loss is comparable between reflection and reflectionless type band-stop filters.

Figure 4B:
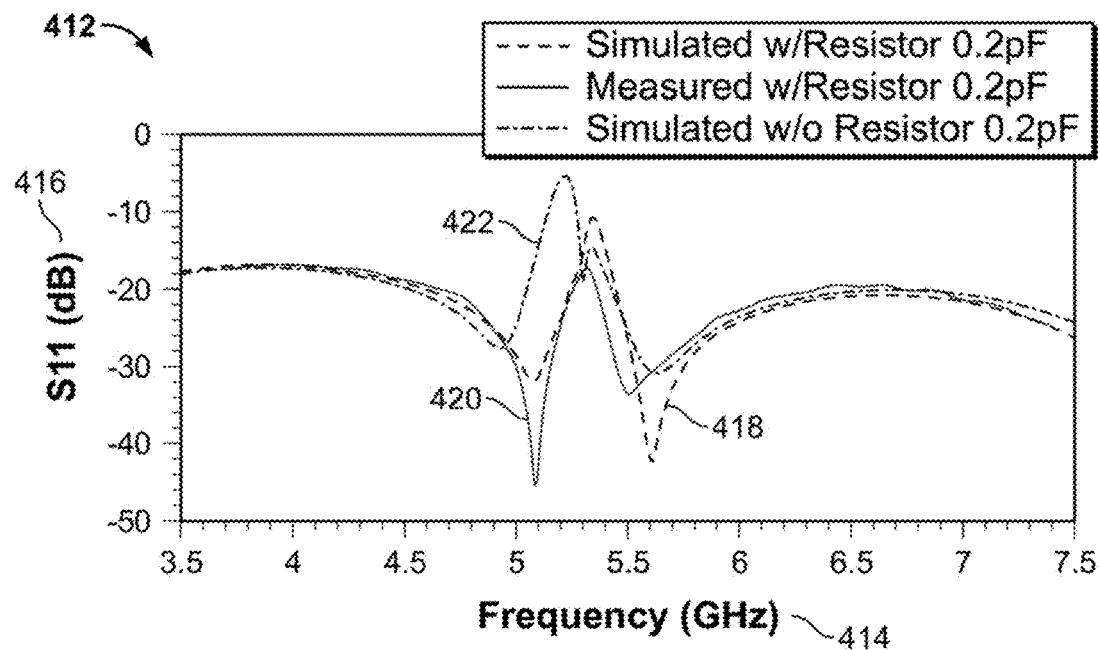
FIG. 4B illustrates a graph of simulated and measured signal return loss of a band-stop filter in accordance with aspects of the present invention.

FIG. 4B illustrates graph 412 comparing the measured and simulated return loss results of band-stop filter 200 in accordance with aspects of the present invention.

As shown in the figure, graph 412 includes an X-Axis 414, a Y-Axis 416, a line 418, a line 420, and a line 422.

X-Axis 414 represents frequency in GHz. Y-Axis 416 represents the insertion loss of band-stop filter 200 in decibels. Line 418 represents the simulated return loss of band-stop filter 200. Line 420 represents the measured return loss of band-stop filter 200. Line 422 illustrates the simulated return loss of a reflective band-stop filter.

In operation, when comparing line 418 and line 420, it can be seen that there is a high correlation between the measured and simulated return loss of an input signal by band-stop filter 200; the measured attenuation is approximately −45 decibels which is better than what was predicted via simulation.

In contrast to FIG. 4A, when comparing line 418 and line 420 to line 422, it can be seen that the amount of return loss increases near the attenuation frequency of 5 GHz rather than decreasing due to the reflection of the unwanted signal portion. In FIG. 4A, there was little difference between reflection and reflectionless type band-stop filters in an insertion loss context. When looking at FIG. 4B, reflectionless type band-stop filters clearly outperform reflection type filters with a difference of 40 decibels in signal return loss.

Returning to FIG. 2, in this example embodiment, each of quarter wave resonator 106, quarter wave resonator 108, quarter wave resonator 110, and quarter wave resonator 112 were designed and arranged to resonate at a frequency f with a wavelength 2. This means that band-stop filter 200 will only operate effectively when attenuating a signal at frequency f, to attenuate any other frequency; a different resonator would need to be used. This is costly and unrealistic design, what is needed is the ability to tune each resonator to a desired frequency.

A frequency tunable implementation of a band-stop filter in accordance with aspects of the present invention will now be discussed with reference to FIGS. 5A-9.

Figure 5A:
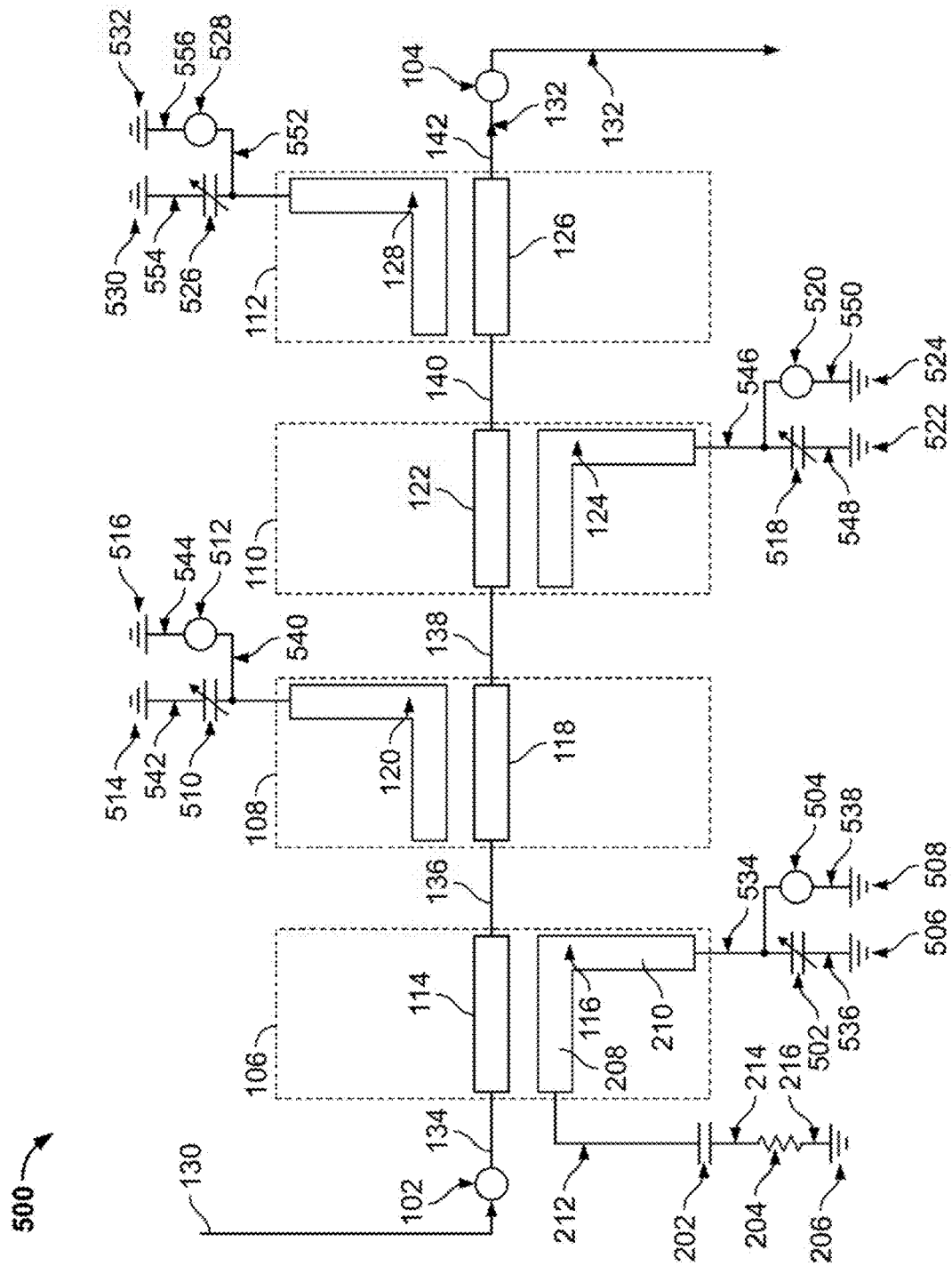
FIG. 5A illustrates a block diagram of a band-stop filter using tunable components to filter a single signal in accordance with aspects of the present invention.

FIG. 5A illustrates band-stop filter 500 with frequency tunability in accordance with aspects of the present invention.

As illustrated in the figure, band-stop filter 500 includes all of the same elements as FIG. 2 and additionally includes a varactor 502, a direct voltage source 504, a ground 506, a ground 508, a varactor 510, a direct voltage source 512, a ground 514, a ground 516, a varactor 518, a direct voltage source 520, a ground 522, a ground 524, a varactor 526, a direct voltage source 528, a ground 530, and a ground 532.

Varactor 502 receives a direct voltage bias from direct voltage source 504, via line 534. Varactor 502 additionally stores a voltage in order to change the electrical length of transmission line element 116, via line 534. Varactor 502 further discharges to ground 506, via line 536.

Varactor 510 receives a direct voltage bias from direct voltage source 512, via line 540. Varactor 510 additionally stores a voltage in order to change the electrical length of transmission line element 120, via line 540. Varactor 510 further discharges to ground 514, via line 542.

Varactor 518 receives a direct voltage bias from direct voltage source 520, via line 546. Varactor 518 additionally stores a voltage in order to change the electrical length of transmission line element 124, via line 546. Varactor 518 further discharges to ground 522, via line 548.

Varactor 526 receives a direct voltage bias from direct voltage source 528, via line 552. Varactor 526 additionally stores a voltage in order to change the electrical length of transmission line element 128, via line 552. Varactor 526 further discharges to ground 530, via line 554.

Direct voltage source 504 provides a direct voltage bias to varactor 502, via line 534. Direct voltage source 504 additionally discharges to ground 508, via line 538. Direct voltage source 512 provides a direct voltage bias to varactor 510, via line 540. Direct voltage source 512 additionally discharges to ground 516, via line 544. Direct voltage source 520 provides a direct voltage bias to varactor 518, via line 546. Direct voltage source 520 additionally discharges to ground 524, via line 550. Direct voltage source 528 provides a bias voltage to varactor 526, via line 552. Direct voltage source 528 additionally discharges to ground 532, via line 556.

Ground 506 provides an electrical ground to varactor 502, via line 536. Ground 508 provides an electrical ground to voltage supply 508, via line 538. Ground 514 provides an electrical ground to varactor 510, via line 542. Ground 516 provides an electrical ground to voltage supply 512, via line 544. Ground 522 provides an electrical ground to varactor 518, via line 548. Ground 524 provides an electrical ground to voltage supply 520, via line 550. Ground 530 provides an electrical ground to varactor 526, via line 554. Ground 532 provides an electrical ground to voltage supply 528, via line 556.

Each varactor, voltage supply and grounds connected to the quarter wave resonators of FIG. 2 are able to apply change the frequency at which they resonate by increasing the electrical length of the transmission line elements that they contain. By changing the electrical length of the transmission line elements, a change in the phase length is induced on any signal traversing the transmission line element. This change in phase length in the quarter wave resonators result in a change of the frequency at which they resonate. After the change, the resonator will reflect the portion of the incoming signal at the new resonant frequency, allowing the attenuation frequency of each resonator to be tuned without the fabrication or addition of separate resonators.

The tuning of a quarter wave resonator in accordance with aspects of the present invention will now be described with additional reference to FIG. 6.

Figure 6:
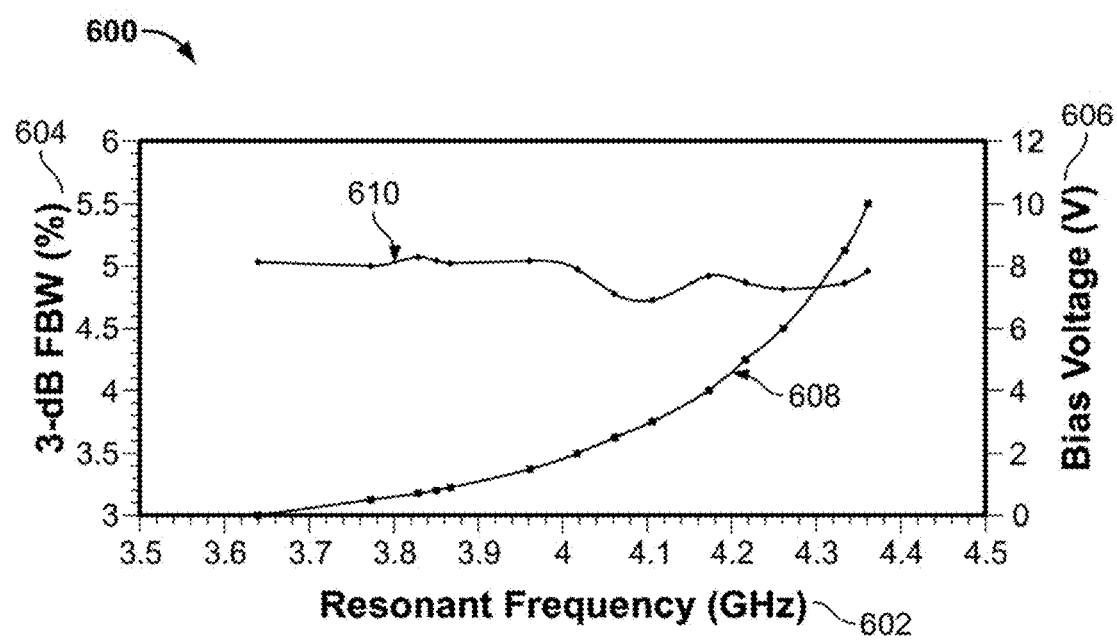
FIG. 6 illustrates a graph of the tuning parameters of a band-stop filter using tunable components in accordance with aspects of the present invention.

FIG. 6 illustrates a graph 600 of the tuning parameters of a quarter wave resonator in accordance with aspects of the present invention.

As shown in the figure, graph 600 includes an X-Axis 602, a Y-Axis 604, a Y-Axis 606, a line 608, and a line 610.

X-Axis 602 represents resonant frequency in GHz. Y-Axis 604 represents fractional bandwidth in decibels. Y-Axis 606 represents direct voltage bias in Volts. Line 608 represents direct voltage bias versus frequency. Line 610 represents fractional bandwidth versus frequency.

In operation, each quarter wave resonator of band-stop filter 500 has been designed to resonate at 3.65 GHz. This can be seen by examining line 608, with a direct voltage bias of 0V, the resonant frequency is 3.65 Hz. In order to achieve high resonant frequencies, a direct voltage bias should be applied to the resonator. Suppose, for example, a resonant frequency of 4.18 GHz was desired. By looking at line 608, it can be seen that a direct voltage bias of 4V would need to be applied. A maximum resonant frequency of 4.35 GHz can be achieved with a direct voltage bias of 10V.

The fractional bandwidth represented by line 610 is defined as the bandwidth of a device divided by its center frequency. Suppose, for example, that band-stop filter 500 has a bandwidth of 3.5 GHz to 4.35 GHz, and a bandwidth of 50 MHz at 4.0 GHz. This would result in a 5% fractional bandwidth. This means that no part of the signal outside of 3.75 GHz to 4.25 GHz would be attenuated by more than 3 dB. This can be seen when examining line 610. The fractional bandwidth that is attenuated is approximately 5% at all frequencies obtained by applying a direct voltage bias between 0V and 10V.

Referring back to FIG. 5A, in operation, suppose that band-stop filter 500 is to attenuate input signal 130 at 4.0 GHz by −50 dB and that input signal 130 is an oscillating signal that has a frequency range of 3 GHz to 6 GHz and is in an even mode. This will be described with additional reference to FIG. 9.

Figure 9:
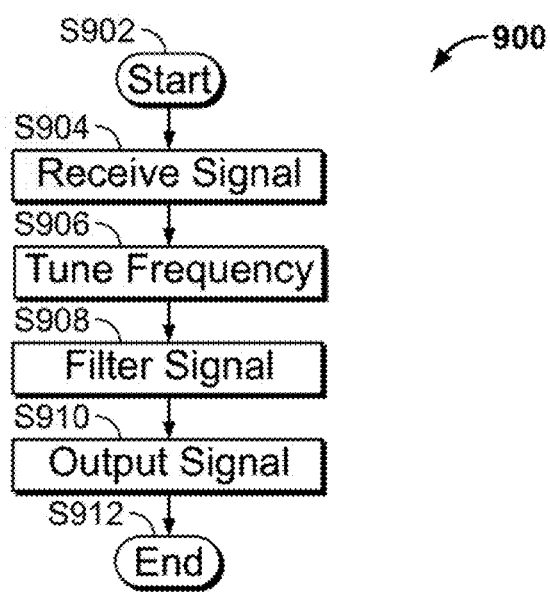
FIG. 9 illustrates a method of the operation of a band-stop filter in accordance with aspects of the present invention.

FIG. 9 illustrates a method 900 of operation of a band-stop filter in accordance with aspects of the present invention As shown in the figure, method 900 starts (S902) and a signal is received (S904). For example, as shown in FIG. 5A, band-stop filter 500 receives input signal 130 at input port 104.

Returning to FIG. 9, after the signal is received (S904), a specific frequency within the signal is tuned (S906). For example, in comparison to FIG. 1, where each resonator was designed to resonate a frequency f in FIG. 5A, each of varactor 502, varactor 510, varactor 518, and varactor 526 are having a direct voltage bias applied by their respective direct voltage sources in order to change the electrical length of the transmission line elements that they are connected to.

In this example embodiment, it can be seen by line 608 of FIG. 6 that a direct voltage bias of 2.5V corresponds to a resonant frequency of 4.0 GHz. So the direct voltage bias applied to each of varactor 502, varactor 510, varactor 518, and varactor 526 is 2.5V, which results in quarter wave resonator 106, quarter wave resonator 108, quarter wave resonator 110, and quarter wave resonator 112 each resonating at 4.0 GHz. Quarter wave resonator 106, quarter wave resonator 108, quarter wave resonator 110, and quarter wave resonator 112 tuning to 4.0 GHz.

At this point, the operation of band-stop filter 500 in FIG. 5A is identical to the operation of band-stop filter 200 in FIG. 2.

Returning to FIG. 9, after a specific frequency within the signal is tuned (S906), the signal is filtered (S908). For example, as shown in FIG. 5A, input signal 130 is received by input port 102 and then provided to quarter wave resonator 106. Quarter wave resonator 106 filters the portion of input signal 130 at 4.0 GHz by −30 dB and provides input signal 130 to quarter wave resonator 108 and the filtered portion of input signal 130 is dissipated by resistor 204.

Next quarter wave resonator 108 reflects the portion of input signal 130 at 4.0 GHz back towards quarter wave resonator 106, where it is received and dissipated by resistor 128. After attenuating input signal 130 another −10 dB, quarter wave resonator 108 provides input signal 130 to quarter wave resonator 110. Quarter wave resonator 110 filters input signal 130 an additional −5 dB and then provides input signal 130 to quarter wave resonator 112. After quarter wave resonator 112 filters input signal 130 an additional −5 dB, input signal 130 has been filtered a total of −50 dB.

Returning to FIG. 9, after the signal is filtered (S908), the filtered signal is output (S910). For example, returning to FIG. 5A, quarter wave resonator 112 provides input signal 130 to output port 104 as filtered signal 132. After receiving filtered signal 132, output port 104 is able to transmit filtered signal 132 to an external source.

Returning to FIG. 9, after the filtered signal is output (S910), method 900 stops (S912).

The attenuation of input signal 130 by each of quarter wave resonator 106, quarter wave resonator 108, quarter wave resonator 110, and quarter wave resonator 112 will now be described with additional reference to FIG. 7.

Figure 7:
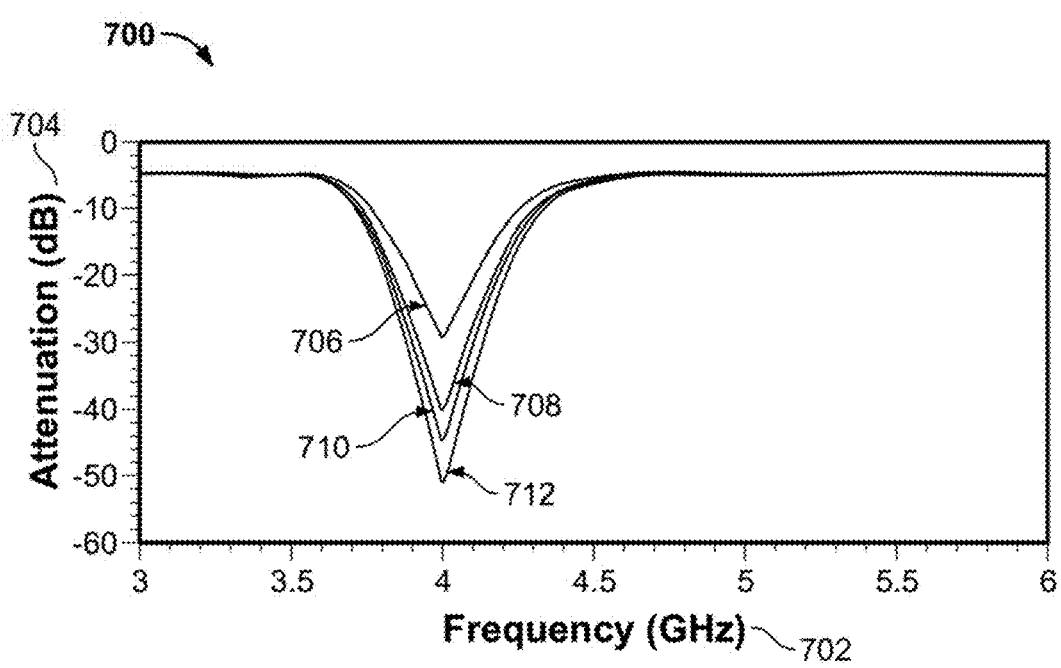
FIG. 7 illustrates a graph of the filtering of a single input signal by a band-stop filter in accordance with aspects of the present invention.

FIG. 7 illustrates a graph 700 of the attenuation of input signal 130 by band-stop filter 500 in accordance with aspects of the present invention.

As shown in the figure, graph 700 includes an X-Axis 702, a Y-Axis 704, a line 706, a line 708, a line 710, and a line 712.

X-Axis 702 represents frequency in GHz. Y-Axis 704 represents attenuation in decibels. Line 706 represents the attenuation of a signal by quarter wave resonator 106. Line 708 represents the attenuation of a signal by quarter wave resonator 108. Line 710 represents the attenuation of a signal by quarter wave resonator 110. Line 712 represents the attenuation of a signal by quarter wave resonator 112.

In operation, since the Q-factor of each of the quarter wave resonators of band-stop filter 500 is limited by a number of factors that are well known in the state of the art, the amount of attenuation that can be applied is also limited. For this reason, multiple quarter wave resonators are used to achieve the desired amount of attenuation.

As shown by line 706, quarter wave resonator 106 is able to achieve −30 dB of attenuation. Having already been attenuated −30 dB, each of the following quarter wave resonators is able to achieve an additional amount of attenuation as shown by line 708, line 710, and line 712.

The operation of band-stop filter 500 filtering multiple input signals at multiple frequencies will now be described with additional reference to FIGS. 5B and 9.

Figure 5B:
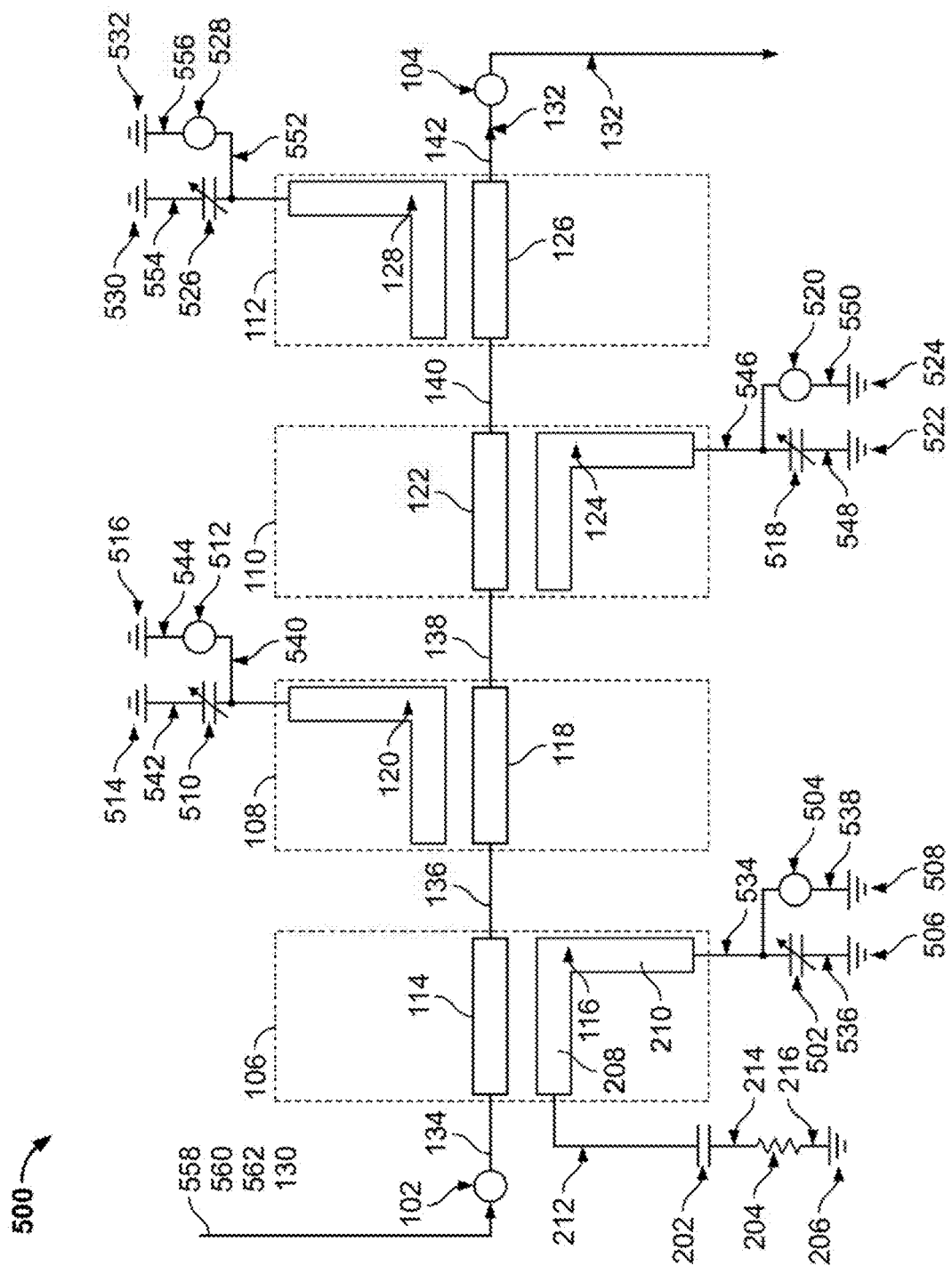
FIG. 5B illustrates a block diagram of a band-stop filter using tunable components to filter a single signal in accordance with aspects of the present invention.

As shown in the figure, all of the elements of FIG. 5A are present in FIG. 5B and their arrangement and operation are identical. In FIG. 5B, input port 102 additionally receives input signal 558, input signal 560 and input signal 562.

In operation, suppose that band-stop filter 500 is now receiving multiple signals that each needs to be filtered at different frequencies. In this example embodiment, input signal 130 needs to be filtered at 4.0 GHz by −50 dB, input signal 558 needs to be filtered at 3.8 GHz by −50 dB, input signal 560 needs to be filtered at 4.2 GHz by −50 dB, and input signal 562 needs to be filtered at 4.35 GHz by −50 dB.

To begin, method 900 starts (S902), and a signal is received (S904). For example, as shown in FIG. 5A, input port 104 receives input signal 130.

Returning to FIG. 9, after the signal is received (S904), a specific frequency within the signal is tuned (S906). Input signal 130 needs to be filtered at 4.0 GHz. In this case, for each of quarter wave resonator 106, quarter wave resonator 108, quarter wave resonator 110, and quarter wave resonator 112, a direct voltage bias of 2.5V is applied to each of their respective varactors in order to tune to 4.0 GHz.

Returning to FIG. 9, after a specific frequency within the signal is tuned (S906), the signal is filtered (S908). At this time, each of quarter wave resonator 106, quarter wave resonator 108, quarter wave resonator 110, and quarter wave resonator 112 filter input signal 130 at 4.0 GHz by a total of −50 dB as described above.

Returning to FIG. 9, after the signal is filtered (S908), the filtered signal is output (S910). For example, as shown in FIG. 5A, after input signal 130 has been filtered, it is transmitted to an external source by output port 104.

Returning to FIG. 9, after the filtered signal is output (S910), method 900 stops (S912).

At some time later, band-stop filter 500 receives input signal 558 which needs to be filtered at 3.8 GHz. In order to filter input signal 558 a direct voltage bias of 0.5V is applied to each varactor in order to resonate each quarter wave resonator at 3.8 GHz. Band-stop filter 500 then uses the same process described above in order to filter input signal 558 at 3.8 GHz.

After filtering input signal 558, band-stop filter 500 receives input signal 560 followed by input signal 562. A direct voltage bias of 4V is applied to each of varactor 502, varactor 510, varactor 518, and varactor 526, in order to filter input signal 560 at 4.2 GHz. A direct voltage bias of 10V is applied to each of varactor 502, varactor 510, varactor 518, and varactor 526, in order to filter input signal 562 at 4.35 GHz.

The attenuation of multiple input signals by band-stop filter 500 will now be described with additional reference to FIG. 8.

Figure 8:
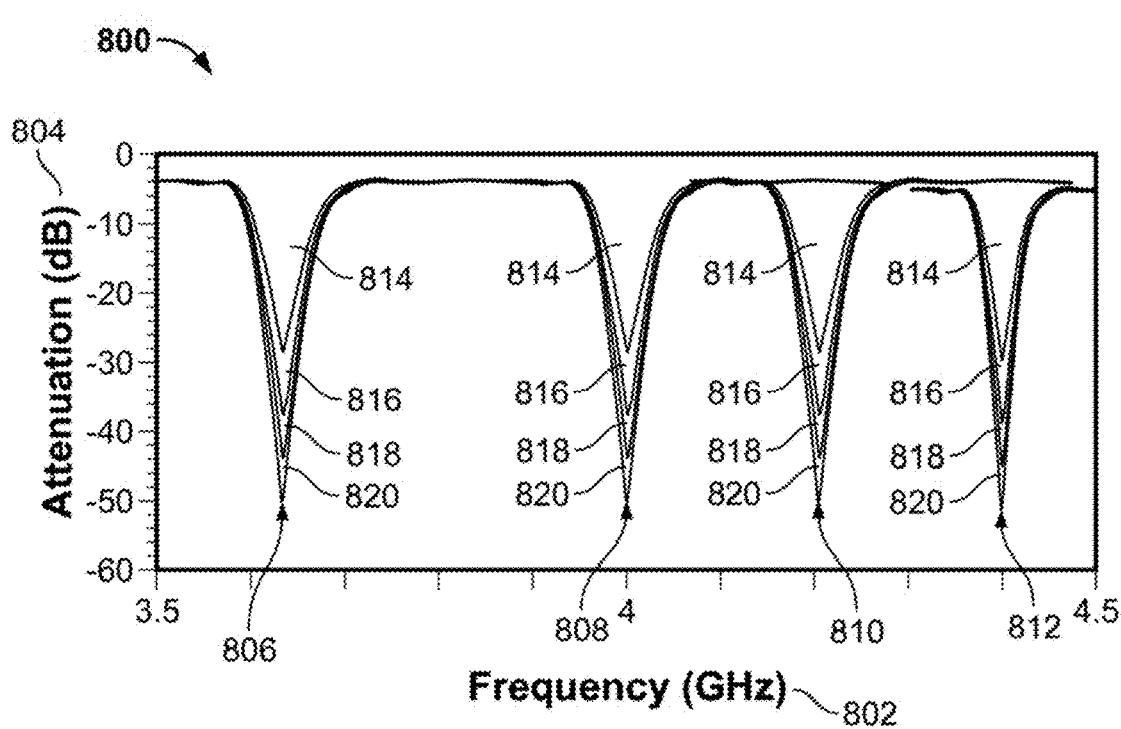
FIG. 8 illustrates a graph of the filtering of multiple input signals by a band-stop filter in accordance with aspects of the present invention.

FIG. 8 illustrates a graph 800 of the attenuation of multiple input signals by band-stop filter 500 in accordance with aspects of the present invention.

As shown in the figure, graph 800 includes an X-Axis 802, a Y-Axis 804, a line 806, a line 808, a line 810, a line 812, a subsection 814, a subsection 816, a subsection 818, and a subsection 820.

X-Axis 802 represents frequency in GHz. Y-Axis 804 represents attenuation in decibels. Line 806 represents the attenuation of input signal 130 by band-stop filter 500. Line 808 represents the attenuation of input signal 558 by band-stop filter 500. Line 810 represents the attenuation of input signal 560 by band-stop filter 500. Line 812 represents the attenuation of input signal 562 by band-stop filter 500.

Subsection 814 represents the portion of a given signal filtered by quarter wave resonator 106. Subsection 816 represents the portion of a given signal filtered by quarter wave resonator 108. Subsection 818 represents the portion of a given signal filtered by quarter wave resonator 110. Subsection 820 represents the portion of a given signal filtered by quarter wave resonator 112.

In operation, band-stop resonator 500 is able to attenuate each input signal it receives at a different frequency as shown by line 806, line 808, line 810, and line 812, each of which represents a signal being filtered at a given frequency.

As seen in graph 800, each quarter wave resonator of band-stop filter 500 is tuned to a specific frequency in order to achieve the required amount of attenuation for a given signal. As shown by subsection 814, quarter wave resonator 106 is able to achieve −30 dB of attenuation at each frequency. Having already been attenuated −30 dB, each of quarter wave resonator 108, quarter wave resonator 110, and quarter wave resonator 112 are able to achieve an additional amount of attenuation as shown by subsection 816, subsection 818, and subsection 820, respectively.

In summary, a problem with the conventional system and method for using band-stop filters for signal processing is that filtering is achieved by reflecting the unwanted portion of the signal back towards its input port. Reflecting the unwanted of the portion of the signal leads to the unwanted portion remixing at the input port, which is undesirable in almost all applications.

The system and method provided in accordance with aspects of the present invention present invention use a capacitor and resistor in order to absorb and dissipate the reflected portion of a signal. In this manner, the unwanted portion of the signal is unable to reach the input port, preventing any self-mixing from occurring.

The quarter wave resonators used for filtering can be cascaded to achieve the desirable amount of attenuation for a given signal. Additionally, each resonator is tunable, allowing the band-stop filter to filter a signal at any needed frequency, eliminating the need for additional resonators.

The foregoing description of various preferred embodiments have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A band-stop filter comprising:
   an input port operable to receive an oscillating signal within a frequency band;
   an output port;
   a coupled line band-stop filter electrically connected between said input port and said output port;
   a capacitor electrically connected with said coupled line band-stop filter; and
   a resistor electrically connected between said capacitor and ground,
   wherein said coupled line band-stop filter comprises a transmission line element and a shaped transmission line element,
   wherein said shaped transmission line element comprises a coupled line element and a second line element, said coupled line element being disposed so as to electromagnetically couple with said transmission line element, and said second line element being electrically connected with said coupled line element and being disposed so as not to be parallel with said transmission line element,
   wherein said capacitor is electrically connected to said coupled line element,
   wherein a portion of the received oscillating signal includes a band-stop frequency,
   wherein attributes of said coupled line band-stop filter, said capacitor, and said resistor, respectively comprising a coupled line band-stop return loss value, a capacitance value, and a resistance value, are such that the portion of the received oscillating signal, including the band-stop frequency, is attenuated,
   wherein said transmission line element is operable to resonate in a first mode and a second mode,
   wherein said transmission line element has an input impedance $Z_{odd}$ when resonating in the first mode,
   wherein said transmission line element has an input impedance $Z_{even}$ when resonating in the second mode,
   wherein an image impedance, $Z_{L1}$ of said transmission line element is defined as $Z_{L1}=(Z_{odd}Z_{even})^{1/2} [(Z_{even}-Z_{odd})/(Z_{even}+Z_{odd})]$, and
   wherein an image impedance, $Z_{L2}$, of said resistor, said capacitor and said shaped transmission line element is defined as $Z_{L2}=(Z_{odd}Z_{even})/Z_{L1}$.

2. The filter of claim 1, further comprising:
   a variable capacitor connected between said second line element and ground; and
   a direct voltage source biasing said variable capacitor.

3. The filter of claim 2, wherein a change in a capacitance of said variable capacitor will shift the bandstop frequency.

4. The filter of claim 1,
   wherein said input port is terminated by a characteristic impedance $Z_0$, and
   wherein said resistor has a resistance, R, defined as $R=Z_0[(Z_{even}+Z_{odd})/(Z_{even}-Z_{odd})]^2$.

5. The filter of claim 4, further comprising:
   a variable capacitor connected between said second line element and ground; and
   a direct voltage source operable to provide a direct voltage bias to said variable capacitor.

6. The filter of claim 5, wherein a change in a capacitance of said variable capacitor will shift the bandstop frequency.

7. A method of filtering an input signal, said method comprising:
   receiving, at an input port, an input oscillating signal within a frequency band;
   an input port operable to receive an oscillating signal within a frequency band;
   filtering, via a band-stop filter, the received oscillating signal; and
   outputting, via an output port, the filtered received oscillating signal,
   wherein the band-stop filter comprises a coupled line band-stop filter, a capacitor, and a resistor,
   wherein the coupled line band-stop filter is electrically connected between the input port and the output port,
   wherein the capacitor is electrically connected with the coupled line band-stop filter,
   wherein the resistor is electrically connected between the capacitor and ground,
   wherein the coupled line band-stop filter comprises a transmission line element and a shaped transmission line element,
   wherein the shaped transmission line element comprises a coupled line element and a second line element, the coupled line element being disposed so as to electromagnetically couple with the transmission line element, the second line element being electrically connected with the coupled line element and being disposed so as not to be parallel with the transmission line element,
   wherein the capacitor is electrically connected to the coupled line element,
   wherein a portion of the received oscillating signal includes a band-stop frequency,
   wherein attributes of the coupled line band-stop filter, the capacitor, and the resistor, respectively comprising a coupled line band-stop return loss value, a capacitance value, and a resistance value, are such that the portion of the received oscillating signal, including the band-stop frequency, is attenuated,
   wherein the transmission line element is operable to resonate in a first mode and a second mode,
   wherein the transmission line element has an input impedance $Z_{odd}$ when resonating in the first mode,
   wherein the transmission line element has an input impedance $Z_{even}$ when resonating in the second mode,
   wherein an image impedance, $Z_{L1}$, of the transmission line element is defined as $Z_{L1}=(Z_{odd}Z_{even})^{1/2} [(Z_{even}-Z_{odd})/(Z_{even}+Z_{odd})]$, and
   wherein an image impedance, $Z_{L2}$, of the resistor, the capacitor and the shaped transmission line element is defined as $Z_{L2}=(Z_{odd}Z_{even})/Z_{L1}$.

8. The method of claim 7, wherein said filtering with the band-stop filter further comprises a variable capacitor connected between the second line element portion and ground and a direct voltage source operable to provide a direct voltage bias to the variable capacitor.

9. The method of claim 8, further comprising changing a capacitance of the variable capacitor to shift the band-stop frequency.

10. The method of claim 7,
    wherein the input port is terminated by a characteristic impedance $Z_0$, and
    wherein the resistor has a resistance, R, defined as $R=Z_0 [(Z_{even}+Z_{odd})/(Z_{even}-Z_{odd})]^2$.

11. The method of claim 10, wherein said filtering with the band-stop filter further comprises a variable capacitor connected between the second line element and ground and a direct voltage source operable to provide a direct voltage bias to the variable capacitor.

12. The method of claim 11, further comprising changing a capacitance of the variable capacitor to shift the band-stop frequency.

13. A band-stop filter comprising:
an input port operable to receive an oscillating signal within a frequency band;
an output port;
a first band-stop filter section electrically connected to said input port; and
a second band-stop filter section disposed between said output port and said first band-stop filter section,
wherein said first band-stop filter section comprises a first coupled line band-stop filter, a first capacitor and a first resistor,
wherein said second band-stop filter section comprises a second coupled line band-stop filter,
wherein said first coupled line band-stop filter is electrically connected to said input port,
wherein said first capacitor electrically is connected with said first coupled line band-stop filter,
wherein said first resistor is electrically connected between said first capacitor and ground,
wherein said first coupled line band-stop filter comprises a first section transmission line element, and a first shaped transmission line element,
wherein said first shaped transmission line element comprises a first section coupled line element and a first section second line element, said first section coupled line element being disposed in parallel with said first section transmission line element, and said first section second line element being electrically connected with said first section coupled line element and being disposed so as not to be parallel with said first section transmission line element,
wherein said first capacitor is electrically connected to said first section coupled line element,
wherein a portion of the received oscillating signal includes a band-stop frequency,
wherein attributes of said first coupled line band-stop filter, said first capacitor, and said first resistor, respectively comprising a first coupled line band-stop return loss value, a capacitance value, and a resistance value, are such that the portion of the received oscillating signal, including the band-stop frequency, is attenuated,
wherein said second coupled line band-stop filter comprises a second section transmission line element and a second shaped transmission line element,
wherein said second shaped transmission line element comprises a second section coupled line element and a second section second line element, said second section coupled line element being disposed so as to electromagnetically couple with said second section transmission line element, and said second section second line element being electrically connected with said second section coupled line element and being disposed so as not to be parallel with said second section transmission line element,
wherein attributes of said second coupled line band-stop filter, comprising a second coupled line band-stop return loss value, are such that the portion of the received oscillating signal, including the band-stop frequency, is further attenuated,
wherein said first section transmission line element is operable to resonate in a first mode and a second mode,
wherein said first section transmission line element has an input impedance $Z_{odd}$ when resonating in the first mode,
wherein said first section transmission line element has an input impedance $Z_{even}$ when resonating in the second mode,
wherein an image impedance, $Z_{L1}$, of said first section transmission line element is defined as $Z_{L1}=(Z_{odd} Z_{even})^{1/2} [(Z_{even}-Z_{odd})/(Z_{even}+Z_{odd})]$, and
wherein an image impedance, $Z_{L2}$, of said first resistor, said first capacitor and said first shaped transmission line element is defined as $Z_{L2}=(Z_{odd}Z_{even})/Z_{L1}$.

14. The filter of claim 13,
wherein said input port is terminated by a characteristic impedance $Z_0$, and
wherein said first resistor has a resistance, R, defined as $R=Z_0[(Z_{even}+Z_{odd})/(Z_{even}-Z_{odd})]^2$.

15. The filter of claim 13, wherein attributes of said second coupled line band-stop filter, comprising a second coupled line band-stop return loss value, are such that a second portion of the received oscillating signal, including a second band-stop frequency, is attenuated.

* * * * *